(12) United States Patent
Fonstad, Jr. et al.

(10) Patent No.: US 7,323,757 B2
(45) Date of Patent: *Jan. 29, 2008

(54) SYSTEM FOR FIELD ASSISTED STATISTICAL ASSEMBLY OF WAFERS

(75) Inventors: Clifton G. Fonstad, Jr., Arlington, MA (US); Markus Zahn, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 1 day.

This patent is subject to a terminal disclaimer.

(21) Appl. No.: 10/350,778

(22) Filed: Jan. 24, 2003

(65) Prior Publication Data

US 2004/0016998 A1    Jan. 29, 2004

Related U.S. Application Data

(60) Provisional application No. 60/362,817, filed on Mar. 7, 2002, provisional application No. 60/351,726, filed on Jan. 24, 2002.

(51) Int. Cl.
*H01L 29/00* (2006.01)
(52) U.S. Cl. .................................................. 257/421
(58) Field of Classification Search .............. 257/190, 257/618, 622, 623, 625, 688, 421, 425, 427, 257/183, 422, 99, E33.066
See application file for complete search history.

(56) References Cited

U.S. PATENT DOCUMENTS 3,439,416 A    4/1969    Yando
5,355,577 A    10/1994   Cohn
5,545,291 A    8/1996    Smith et al.
5,783,856 A    7/1998    Smith et al.

(Continued)

OTHER PUBLICATIONS

"Electroplated thick permanent magnet arrays with controlled direction of magnetization for MEMS application," Cho et al. *Journal of Applied Physics*. May 2000. vol. 87, No. 9.

*Primary Examiner*—Matthew C. Landau
(74) *Attorney, Agent, or Firm*—Gauthier & Connors LLP

(57) ABSTRACT

A wafer having heterostructure therein is formed using a substrate with recesses formed within a dielectric layer. A magnetized magnetic layer or a polarized electret material is formed at the bottom of each recess. The magnetized magnetic layer or a polarized electret material provides a predetermined magnetic or electrical field pattern. A plurality of heterostructures is formed from on an epitaxial wafer wherein each heterostructure has formed thereon a non-magnetized magnetic layer that is attracted to the magnetized magnetic layer formed at the bottom of each recess or dielectric layer that is attracted to the polarized electret material formed at the bottom of each recess. The plurality of heterostructures is etched from the epitaxial wafer to form a plurality of heterostructure pills. The plurality of heterostructure pills is slurried over the surface of the dielectric layer so that individual heterostructure pills can fall into a recess and be retained therein due to the strong short-range magnetic or electrical attractive force between the magnetized magnetic layer in the recess and the non-magnetized magnetic layer on the heterostructure pill or between the polarized electret material in the recess and the dielectric on the heterostructure pill. Any excess heterostructure pills that are not retained in a recess formed within the dielectric layer are removed and an overcoat is applied to form a substantial planar surface.

13 Claims, 9 Drawing Sheets

U.S. PATENT DOCUMENTS

| | | |
|---|---|---|
| 5,824,186 A | 10/1998 | Smith et al. |
| 5,904,545 A | 5/1999 | Smith et al. |
| 6,300,149 B1 | 10/2001 | Smith |
| 6,495,019 B1 * | 12/2002 | Filas et al. .................. 205/119 |
| 6,521,931 B2 * | 2/2003 | Sandhu et al. .............. 257/295 |
| 6,555,889 B2 * | 4/2003 | Hiramoto et al. ........... 257/421 |
| 6,614,103 B1 * | 9/2003 | Durocher et al. ............ 257/678 |
| 6,661,071 B2 * | 12/2003 | Lenssen et al. ............. 257/422 |
| 6,780,696 B1 * | 8/2004 | Schatz ........................ 438/216 |
| 2002/0005294 A1 * | 1/2002 | Mayer et al. ................ 174/260 |
| 2002/0017667 A1 * | 2/2002 | Shimoda et al. ............ 257/295 |

* cited by examiner

SYSTEM FOR FIELD ASSISTED STATISTICAL ASSEMBLY OF WAFERS

PRIORITY INFORMATION

This application claims priority, under 35 U.S.C. § 119, from U.S. Provisional Patent Application Ser. No. 60/351,726, filed on Jan. 24, 2002, and U.S. Provisional Patent Application Ser. No. 60/362,817, filed on Mar. 7, 2002. The entire contents of U.S. Provisional Patent Applications, Ser. Nos. 60/351,726 and 60/362,817, are hereby incorporated by reference.

FIELD OF THE PRESENT INVENTION

The present invention is directed to the manufacturing of electronic integrated circuits. More particularly, the present invention is directed to the manufacture of microstructures onto a substrate.

BACKGROUND OF THE PRESENT INVENTION

The importance of integrating different materials and different device functions, a process generally termed heterogeneous integration, is widely recognized. So too are the problems inherent in combining different materials. Principal amongst those problems is that of thermal expansion coefficient differences because the thermal expansion mismatch between silicon, the primary material of interest for large-scale high-density integrated circuits, and III-V compounds, the materials of interest for optoelectronic and microwave devices and circuits, is very large. The difference between the thermal expansion coefficient of GaAs, for example, and the thermal expansion coefficient of Si exceeds $4 \times 10^{-6}$ $C.^{-1}$.

To put this in perspective, the diameters of GaAs and Si wafers that are identical at room temperature (150 mm) will differ by 70 µm at 100° C. Such large mismatches make it difficult to grow device-quality III-V heterostructures directly on silicon wafers, or to bond full wafers of III-V devices with full silicon integrated circuit wafers.

Several methods have been proposed for fabricating individual electronic components (or generally microstructures) and assembling such structures onto a substrate. One approach is to grow GaAs devices directly onto a silicon substrate. This approach becomes limiting because the lattice structure of GaAs mismatches that of silicon. In addition, growing GaAs onto silicon is inherently difficult and therefore costly. Accordingly, GaAs or InP cannot efficiently be grown on a silicon substrate.

However, for the most part, heterogeneous integration today is done by using some variation of flip-chip solder-ball (or solder-bump) bonding to attach modest size arrays of, for example, vertical-cavity surface emitting lasers (VCSELs) on individual integrated circuit chips. This approach works, but it also has serious limitations.

In particular, the size of the device array that can be bonded depends on the bonding temperature, and is typically limited to a centimeter on a side. Also, for the best results, the substrate of the device array must be thinned and, ideally, totally removed leaving the device in the array separated one from the other. This involves extensive additional processing. Finally, because the industry standard for silicon integrated circuit wafers is 200 mm in diameter, and for GaAs wafers it is 150 mm, bonding full wafers is impractical. One is forced to bond pieces of wafers and to use a tiling process to cover a full wafer.

Another approach to heterogeneous integration is called the optical solder bump process. The essential approach of the optical solder bump process is to put compound semiconductor heterostructures in recesses in the surface of commercially-processed integrated circuit wafers and to then fabricate those heterostructures into devices (typically, but not exclusively, optoelectronic devices) monolithically integrated with the pre-existing VSLI-level electronic circuitry.

An alternative approach to bonding ensembles of devices that are then divided into individual devices is to begin with individual devices and to attach each in its proper place on the integrated circuit surface. Such an approach sounds impractical at first, but upon further thought one realizes that it offers significant advantages once the assembly process is perfected. It circumvents the problem of smaller compound semiconductor wafer sizes, it can be used with any material with minimal concern with thermal expansion coefficient, and it can be used to assemble several different types of devices on a single substrate.

Two approaches of this type are the DNA and electrophoresis-assisted assembly techniques, and the fluidic self-assembly technique. These techniques each involve the location and attachment of many individual units on processed integrated circuits (or other electronic substrates), and their subsequent electrical interconnection. The individual units may be single devices, small assemblies of devices, or full integrated circuits.

In the DNA and electrophoresis-assisted assembly approach, a DNA-like polymer film is put on the individual units and a complementary film is patterned on the circuit (or a handle wafer) surface where the units are to be placed. The attraction between the two complementary DNA films then locates and holds the units in position. Electrophoresis can also be used to attract and locate device units in place on a surface electrode pattern.

In the fluidic self-assembly approach, the individual units are etched to have slanted slides which match the size and shape of recesses formed in the substrate, the idea being that the units only fit in the recesses in one way. A fluid carrying many units is flowed over the surface of the substrate, and gravity is relied upon to get the units into the recesses and to hold them there.

Another approach is described by Yando in U.S. Pat. No. 3,439,416. Yando describes components or structures placed, trapped, or vibrated on an array of magnets. Such magnets include magnetized layers alternating with non-magnetized layers to form a laminated structure. Components are matched onto the array of magnets forming an assembly thereof. However, severe limitations exist on the shape, size, and distribution of the components. Component width must match the spacing of the magnetic layers and the distribution of components are constrained by the parallel geometry of lamination. In addition, self-alignment of components requires the presence of the laminated structure. Furthermore, the structures disclosed by Yando typically possess millimeter-sized dimensions and are therefore generally incompatible with micron sized integrated circuit structures. Accordingly, the method and structure disclosed by Yando is thereby too large and complicated to be effective for assembling a state-of-art microstructure or component onto a substrate.

Another approach involves mating physical features between a packaged surface mount device and substrate as described in U.S. Pat. No. 5,034,802, Liebes, Jr. et al. The assembly process described requires a human or robotics arm to physically pick, align, and attach a centimeter sized packaged surface mount device onto a substrate. Such a process is limiting because of the need for the human or robotics arm. The human or robotics arm assembles each packaged device onto the substrate one-by-one and not simultaneously, thereby limiting the efficiency and effectiveness of the operation. Moreover, the method uses centimeter sized devices (or packed surface mount integrated circuits), and would have little applicability with micron sized integrated circuits in die form.

Another approach, such as the one described in U.S. Pat. No. 4,542,397, Biegelsen et al. involves a method of placing parallelogram shaped structures onto a substrate by mechanical vibration. Alternatively, the method may also employ pulsating air through apertures in the support surface (or substrate). A limitation to the method includes an apparatus capable of vibrating the structures, or an apparatus for pulsating air through the apertures. Moreover, the method described relies upon centimeter-sized dies and would have little applicability with state-of-art micron sized structures.

A further approach such as that described in U.S. Pat. No. 4,194,668 by Akyurek discloses an apparatus for aligning and soldering electrode pedestals onto solderable ohmic anode contacts. The anode contacts are portions of individual semiconductor chips located on a wafer. Assembling the structures requires techniques of sprinkling pedestals onto a mask and then electromagnetic shaking such pedestals for alignment. The method becomes limiting because of the need for a shaking apparatus for the electromagnetic shaking step. In addition, the method also requires a feed surface gently sloping to the mask for transferring electronic pedestals onto the mask. Moreover, the method is solely in context to electrode pedestals and silicon wafers, thereby limiting the use of such method to these structures.

Still another approach requires assembling integrated circuits onto a substrate through electrostatic forces as described in U.S. Pat. No. 5,355,577 to Cohn. The electrostatic forces vibrate particles such that the particles are arranged at a state of minimum potential energy. A limitation with such method includes providing an apparatus capable of vibrating particles with electrostatic forces. Moreover, the method of Cohn creates damage to a portion of the integrated circuits by mechanically vibrating them against each other and is also generally ineffective. Accordingly the method typically becomes incompatible with a state-of-art microstructure.

In another approach, to assemble GaAs microstructures onto a silicon wafer, trapezoidal shaped GaAs blocks self-align into inverted trapezoidal shaped recessed regions located on the top surface of the silicon wafer. Steps for such a process include forming the GaAs blocks, transferring the GaAs blocks into a solution forming a slurry, and spreading the slurry evenly over the top surface of a silicon substrate having recessed regions. During the spreading steps, the GaAs blocks self-align and settle into the recessed regions while being transported with the fluid across the top surface. A limitation with such method is the lack of a mechanism to keep the trapezoidal shaped GaAs blocks in the inverted trapezoidal shaped recessed regions of the surface once the GaAs blocks are aligned with the recesses. As the slurry moves over the surface of the silicon wafer, the trapezoidal shaped GaAs blocks may disengage from the inverted trapezoidal shaped recessed regions and become part of the slurry again, thereby reducing the effectiveness of this approach.

A further approach to assembling microstructures onto a substrate, Epitaxy-on-Electronics, is illustrated in FIGS. 1-3. As illustrated in FIG. 1, upon a GaAs wafer 1, GaAs MESFET circuitry 3 with multi-layer interconnects is formed. The GaAs wafer 1 further includes a dielectric growth well or recess 5 that includes an n+ region 7 at its base. Upon the GaAs MESFET circuitry 3, as shown in FIG. 2, a polycrystalline 9 is deposited and an epitaxial heterostructure 11 is formed in the dielectric growth well or recess 5. A monolithically integrated surface emitting diode is formed from the epitaxial heterostructure 11, as illustrated in FIG. 3, and thereafter a glass overlay 13 is formed over the entire surface.

The integrated circuits in the Epitaxy-on-Electronics process, as illustrated in FIGS. 1-3, are GaAs integrated circuits because the recesses 5 in the dielectric penetrate all of the way to the substrate 1 and the heterostructures 11 are formed in the recesses 5 by direct Epitaxy.

Epitaxy-on-Electronics is a very effective technique, but it does have limitations. First, it requires epitaxy on the integrated circuit substrate, which, as a practical matter, means that Epitaxy-on-Electronics cannot be used with silicon integrated circuits for the majority of heterostructure devices of interest. The epitaxy must also be done at less than 500° C. to avoid damaging the preexisting electronics, and this, and the semi-insulating IC substrate itself, can place a limitation on material quality.

To get around some of the limitations of the Epitaxy-on-Electronics process the aligned pillar bonding technique (APB) was developed. The aligned pillar bonding process is illustrated in FIGS. 4-8.

In the aligned pillar bonding process, as illustrated in FIG. 4, a wafer 21 has formed thereupon electronics 23 and a recess or well 25. The compound semiconductor heterostructures 29 are grown, as shown in FIG. 5, on optimal substrates 27 under optimum conditions. The compound semiconductor heterostructures 29 are then etched into a pattern of pillars mirroring the pattern of recesses 25 on the integrated circuit wafer 21. The etched compound semiconductor heterostructures 29 are aligned, as shown in FIG. 6, with the recesses 25 using techniques common to MEMS processing. The etched compound semiconductor heterostructures 29 are then bonded into position, as shown in FIG. 7, by a semiconductor-to-metal bond. Lastly, in FIG. 8, further processing of the bonded semiconductor heterostructures 29 produce an integrated photodiode with a dielectric overcoat 31 thereon.

The heterostructure and IC substrates must have matching thermal expansion coefficients if the aligned pillar bonding process is to be performed over large areas, i.e., on a full wafer scale, and this in turn means that the IC must be fabricated using a GaAs or a Si-on-sapphire process. Aligned pillar bonding process thus does allow access to silicon circuitry, but it does not take advantage of the very large diameter Si wafers that are available because it is limited by the diameter of the heterostructure substrate. It also, of course, can only be used with standard silicon CMOS, for example, if used on partial wafers.

Therefore, it is desirable to develop a method of assembling microstructures onto a substrate that is compact, low cost, efficient, reliable, and requires little maintenance. Moreover, it is desirable to develop a method of assembling microstructures onto a substrate that can be done in such a manner to avoid damaging the preexisting electronics. Furthermore, it is desirable to develop a method of assembling microstructures onto a substrate that takes advantage of the very large diameter Si wafers.

SUMMARY OF THE PRESENT INVENTION

A first aspect of the present invention is a wafer. The wafer includes a substrate; a dielectric layer formed on the substrate; at least one recess formed within the dielectric layer during fabrication; a first magnetic layer formed in at least one recess, the first magnetic layer being etched in a predetermined pattern; and a heterostructure pill, having formed thereon a second magnetic layer, located in a recess formed within the dielectric layer, the first and second magnetic layer being adjacently located.

A second aspect of the present invention is a wafer. The wafer includes a substrate; a dielectric layer formed on the substrate; at least one recess formed within the dielectric layer during fabrication; and a magnetic layer formed in at least one recess, the magnetic layer being etched in a predetermined pattern.

A third aspect of the present invention is a microstructure device. The device includes a heterostructure and a magnetic layer formed on a surface of the heterostructure.

A fourth aspect of the present invention is a method for fabricating a wafer. The method provides a substrate with a dielectric layer formed thereon; forms at least one recess within the dielectric layer; forms a first magnetic layer in at least one recess; etches the first magnetic layer into a predetermined pattern; magnetizes the patterned first magnetic layer; forms a plurality of heterostructures on an epitaxial wafer, each heterostructure having formed thereon a second magnetic layer; etches the plurality of heterostructures from the epitaxial wafer to form a plurality of heterostructure pills; slurries the plurality of heterostructure pills over the surface of the dielectric layer having at least one recess; and removes any excess heterostructure pills not retained in a recess formed within the dielectric layer.

A fifth aspect of the present invention is a method for forming a wafer. The method provides a substrate with a dielectric layer formed thereon; forms at least one recess within the dielectric layer; forms a magnetic layer in at least one recess; etches the magnetic layer into a predetermined pattern; and magnetizes the patterned magnetic layer.

A sixth aspect of the present invention is a method for forming a plurality of heterostructure pills. The method forms a plurality of heterostructures on an epitaxial wafer, each heterostructure having formed thereon a magnetic layer, and etches the plurality of heterostructures from the epitaxial wafer to form a plurality of heterostructure pills.

A seventh aspect of the present invention is a wafer. The wafer includes a substrate; a dielectric layer formed on the substrate; at least one recess formed within the dielectric layer during fabrication; a magnetizable layer formed in at least one recess, the magnetizable layer being magnetized in a predetermined pattern; and a heterostructure pill, having formed thereon a magnetic layer, located in a recess formed within the dielectric layer, the magnetizable layer and magnetic layer being adjacently located.

An eighth aspect of the present invention is a wafer. The wafer includes a substrate; a dielectric layer formed on the substrate; at least one recess formed within the dielectric layer during fabrication; and a magnetizable layer formed in at least one recess, the magnetizable layer being magnetized in a predetermined pattern.

A ninth aspect of the present invention is a method for fabricating a wafer. The method provides a substrate with a dielectric layer formed thereon; forms at least one recess within the dielectric layer; forms a magnetizable layer in at least one recess; magnetizes the magnetizable layer into a predetermined pattern; forms a plurality of heterostructures on an epitaxial wafer, each heterostructure having formed thereon a magnetic layer; etches the plurality of heterostructures from the epitaxial wafer to form a plurality of heterostructure pills; slurries the plurality of heterostructure pills over the surface of the dielectric layer having at least one recess; and removes any excess heterostructure pills not retained in a recess formed within the dielectric layer.

A tenth aspect of the present invention is a method for forming a wafer. The method provides a substrate with a dielectric layer formed thereon; forms at least one recess within the dielectric layer; forms a magnetizable layer in at least one recess; and magnetizes the magnetizable layer into a predetermined pattern.

A further aspect of the present invention is a wafer. The wafer includes a substrate; a dielectric layer formed on the substrate; at least one recess formed within the dielectric layer during fabrication; a micro-electromagnet formed in at least one recess; and a heterostructure pill, having formed thereon a magnetic layer, located in a recess formed within the dielectric layer, the micro-electromagnet and the magnetic layer being adjacently located.

A still further aspect of the present invention is a wafer. The wafer includes a substrate; a dielectric layer formed on the substrate; at least one recess formed within the dielectric layer during fabrication; and a micro-electromagnet formed in at least one recess.

Another aspect of the present invention is a method for fabricating a wafer. The method provides a substrate with a dielectric layer formed thereon; forms at least one recess within the dielectric layer; forms a micro-electromagnet in at least one recess; forms a plurality of heterostructures on an epitaxial wafer, each heterostructure having formed thereon a magnetic layer; etches the plurality of heterostructures from the epitaxial wafer to form a plurality of heterostructure pills; slurries the plurality of heterostructure pills over the surface of the dielectric layer having at least one recess; and removes any excess heterostructure pills not retained in a recess formed within the dielectric layer.

A further aspect of the present invention is a method for forming a wafer. The method provides a substrate with a dielectric layer formed thereon; forms at least one recess within the dielectric layer; and forms a micro-electromagnet in at least one recess.

A further aspect of the present invention is a wafer. The wafer includes a substrate; a dielectric layer formed on the substrate; at least one recess formed within the dielectric layer during fabrication; an electret material formed in at least one recess, the electret material being etched in a predetermined pattern; and a heterostructure pill, having formed thereon a dielectric layer, located in a recess formed within the dielectric layer, the electret material and the dielectric layer of the heterostructure pill being adjacently located.

A further aspect of the present invention is a wafer. The wafer includes a substrate; a dielectric layer formed on the substrate; at least one recess formed within the dielectric layer during fabrication; and an electret material formed in at least one recess, the electret material being etched in a predetermined pattern.

A still further aspect of the present invention is a microstructure device. The device includes a heterostructure and a dielectric layer formed on a surface of the heterostructure.

A further aspect of the present invention is a method for fabricating a wafer. The method provides a substrate with a dielectric layer formed thereon; forms at least one recess within the dielectric layer; forms an electret material layer in at least one recess; etches the electret material layer into a predetermined pattern; polarizes the patterned electret material layer; forms a plurality of heterostructures on an epitaxial wafer, each heterostructure having formed thereon a dielectric layer; etches the plurality of heterostructures from the epitaxial wafer to form a plurality of heterostructure pills; slurries the plurality of heterostructure pills over the surface of the dielectric layer having at least one recess; and removes any excess heterostructure pills not retained in a recess formed within the dielectric layer.

A still further aspect of the present invention is a method for forming a wafer. The method provides a substrate with a dielectric layer formed thereon; forms at least one recess within the dielectric layer; forms an electret material layer in at least one recess; etches the electret material layer into a predetermined pattern; and polarizes the patterned electret material layer.

A further aspect of the present invention is a method for forming a plurality of heterostructure pills. The method forms a plurality of heterostructures on an epitaxial wafer, each heterostructure having formed thereon a dielectric layer, and etches the plurality of heterostructures from the epitaxial wafer to form a plurality of heterostructure pills.

A still further aspect of the present invention is a wafer. The wafer includes a substrate; a dielectric layer formed on the substrate; at least one recess formed within the dielectric layer during fabrication; a polarizable electret material layer formed in at least one recess, the polarizable electret material layer being polarized in a predetermined pattern; and a heterostructure pill, having formed thereon a dielectric layer, located in a recess formed within the dielectric layer, the polarizable electret material layer and the dielectric layer of the heterostructure pill being adjacently located.

A further aspect of the present invention is a wafer. The wafer includes a substrate; a dielectric layer formed on the substrate; at least one recess formed within the dielectric layer during fabrication; and a polarizable electret material layer formed in at least one recess, the polarizable electret material layer being polarized in a predetermined pattern.

A still further aspect of the present invention is a method for fabricating a wafer. The method provides a substrate with a dielectric layer formed thereon; forms at least one recess within the dielectric layer; forms a polarizable electret material layer in at least one recess; polarizes the polarizable electret material layer into a predetermined pattern; forms a plurality of heterostructures on an epitaxial wafer, each heterostructure having formed thereon a dielectric layer; etches the plurality of heterostructures from the epitaxial wafer to form a plurality of heterostructure pills; slurries the plurality of heterostructure pills over the surface of the dielectric layer having at least one recess; and removes any excess heterostructure pills not retained in a recess formed within the dielectric layer.

A further aspect of the present invention is a method for forming a wafer. The method provides a substrate with a dielectric layer formed thereon; forms at least one recess within the dielectric layer; forms a polarizable electret material layer in at least one recess; and polarizes the polarizable electret material layer into a predetermined pattern.

A still further aspect of the present invention is a wafer. The wafer includes a substrate; a dielectric layer formed on the substrate; at least one recess formed within the dielectric layer during fabrication; a microelectrode formed in at least one recess; and a heterostructure pill, having formed thereon a dielectric layer, located in a recess formed within the dielectric layer, the microelectrode and the dielectric layer of the heterostructure pill being adjacently located.

A further aspect of the present invention is a wafer. The wafer includes a substrate; a dielectric layer formed on the substrate; at least one recess formed within the dielectric layer during fabrication; and a microelectrode formed in at least one recess.

A still further aspect of the present invention is a method for fabricating a wafer. The method provides a substrate with a dielectric layer formed thereon; forms at least one recess within the dielectric layer; forms a microelectrode in at least one recess; forms a plurality of heterostructures on an epitaxial wafer, each heterostructure having formed thereon a dielectric layer; etches the plurality of heterostructures from the epitaxial wafer to form a plurality of heterostructure pills; slurries the plurality of heterostructure pills over the surface of the dielectric layer having at least one recess; and removes any excess heterostructure pills not retained in a recess formed within the dielectric layer.

A further aspect of the present invention is a method for forming a wafer. The method provides a substrate with a dielectric layer formed thereon; forms at least one recess within the dielectric layer; and forms a microelectrode in at least one recess.

BRIEF DESCRIPTION OF THE DRAWINGS

The present invention may take form in various components and arrangements of components, and in various steps and arrangements of steps. The drawings are only for purposes of illustrating a preferred embodiment and are not to be construed as limiting the present invention, wherein.

DETAILED DESCRIPTION OF THE PRESENT INVENTION

Figure 1:
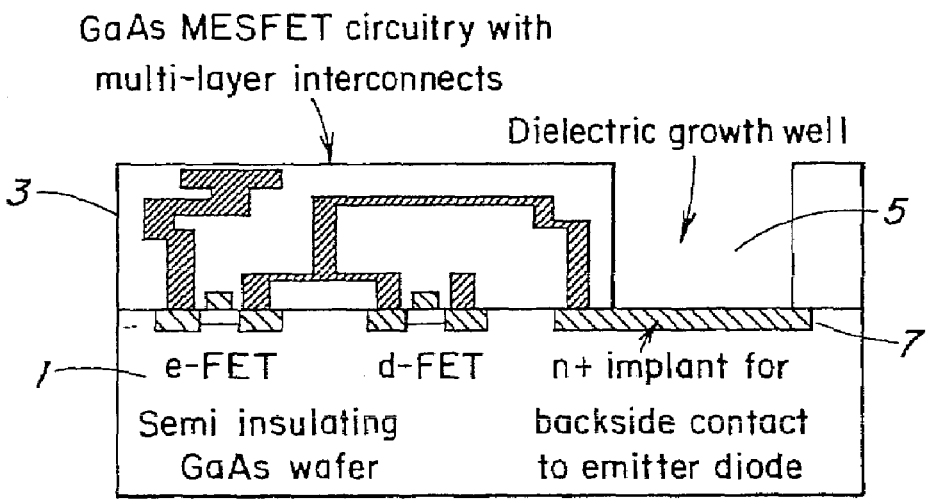
FIGS. 1-3 show an epitaxy-on-electronics process for assembling microstructures on a substrate.
Figure 2:
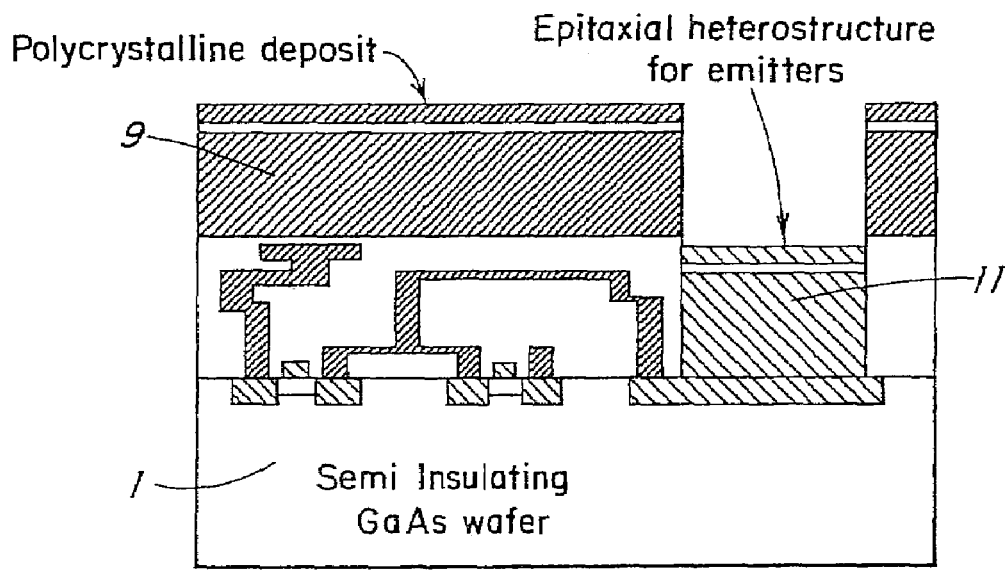
Figure 3:
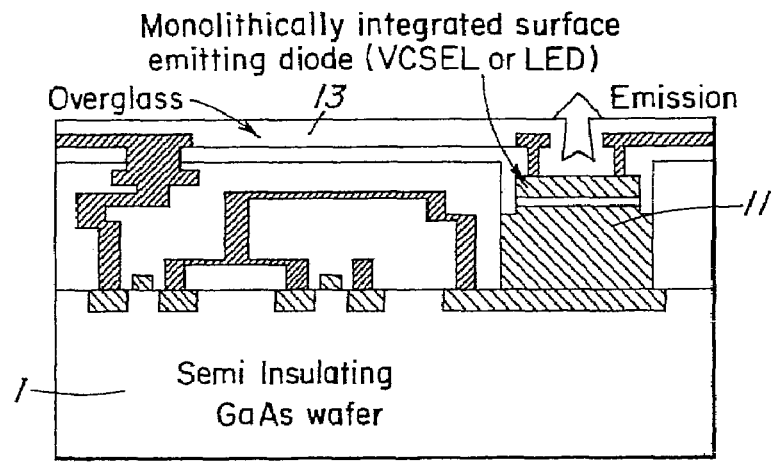
Figure 4:
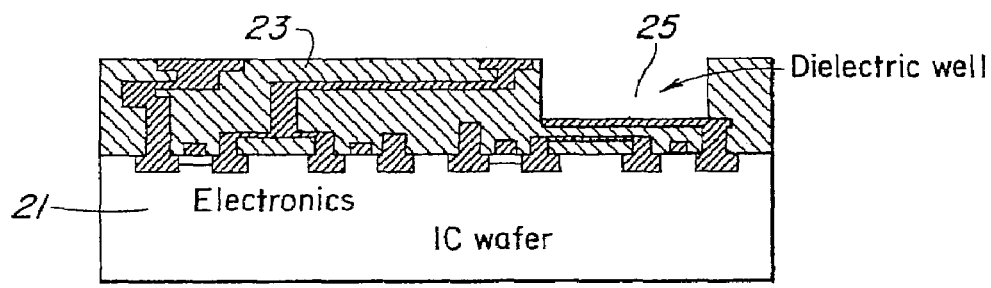
FIGS. 4-8 illustrate an aligned pillar bonding process for assembling microstructures on a substrate.
Figure 5:
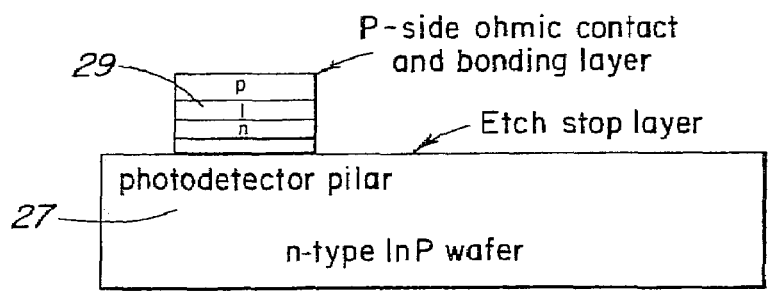
Figure 6:
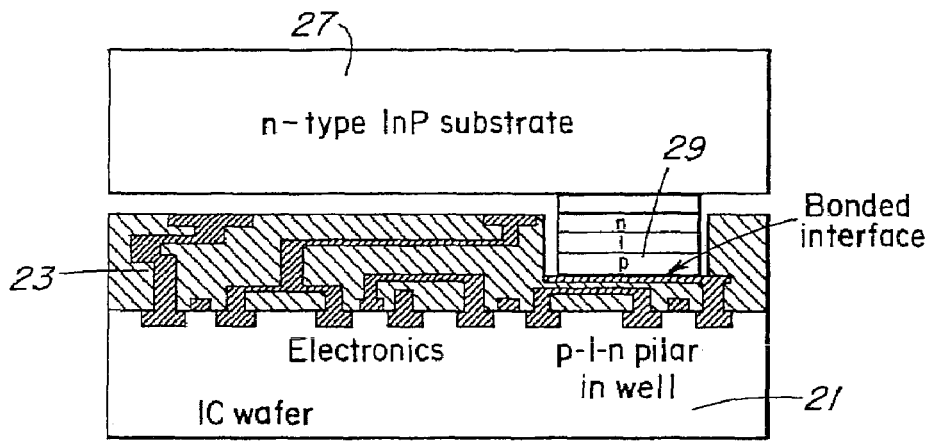
Figure 7:
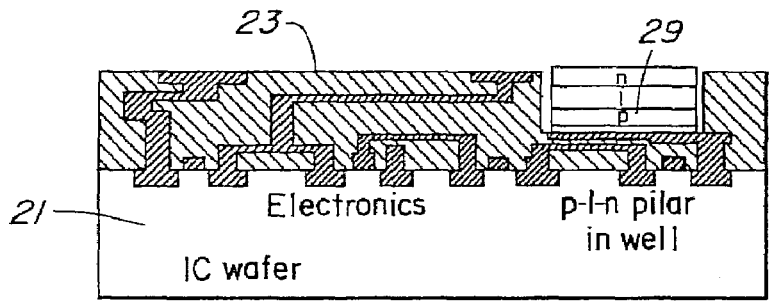
Figure 8:
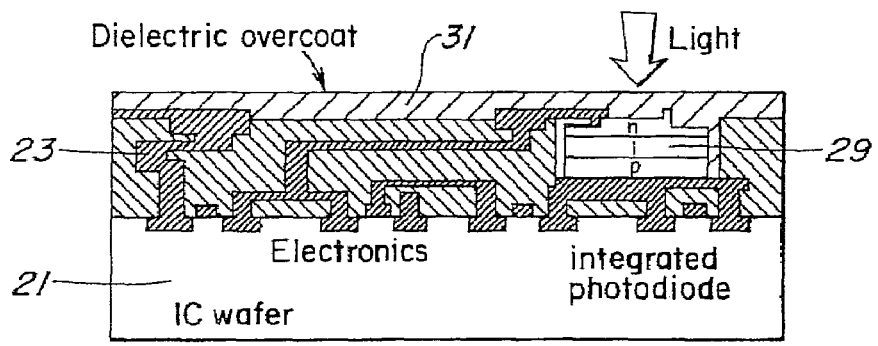

The present invention will be described in connection with preferred embodiments; however, it will be understood that there is no intent to limit the present invention to the embodiments described herein. On the contrary, the intent is to cover all alternatives, modifications, and equivalents as may be included within the spirit and scope of the present invention as defined by the appended claims.

For a general understanding of the present invention, reference is made to the drawings. In the drawings, like reference have been used throughout to designate identical or equivalent elements. It is also noted that the various drawings illustrating the present invention are not drawn to scale and that certain regions have been purposely drawn disproportionately so that the features and concepts of the present invention could be properly illustrated.

It is noted that in describing the various aspects of the present invention, the term pill has been used. Pill defines an individual semiconductor heterostructure that can be assembled on an integrated circuit wafer, silicon wafer, or any other semiconductor wafer or substrate. The semiconductor heterostructure pills may be of various shapes so long as the shape is associated with the recess of the substrate in which it will be assembled. Moreover, the semiconductor heterostructure pills may represent a variety of microstructures, microdevices, or microcircuits.

As noted above, the monolithic integration of compound semiconductor devices with silicon CMOS ICs is complicated by two major factors: the large thermal expansion coefficient mismatch between silicon and other semiconductors, and the large mismatch in wafer diameters between silicon and other semiconductors. Because of these differences, most integration of compound semiconductors and silicon is done a chip at a time using long-established hybrid bump-bonding techniques. While these methods are able to begin to satisfy many immediate application needs, these methods do not enjoy the economic advantages of wafer-scale, batch processing found in true monolithic integration, nor do these methods offer the advantages of reduced parasitics, robustness of structure, and density of integration that can be obtained from monolithic integration. In view of the disadvantages of the conventional methods, the present invention provides a method that essentially achieves all of the economic, structural, and performance advantages of true monolithic integration and to do so in a modular fashion building upon commercial silicon integrated circuit processes.

The essential approach of the present invention is to put compound semiconductor heterostructures in recesses in the surface of commercially-processed integrated circuit wafers and to then fabricate those heterostructures into devices (typically, but not exclusively, optoelectronic devices) monolithically integrated with the pre-existing VSLI-level electronic circuitry. This process of locating device heterostructures in recesses of the wafer's surface through statistical assembly, and doing the final device patterning, processing, and integration after assembly at the wafer level and in a batch mode is illustrated generally in FIGS. 9-13.

Figure 9:
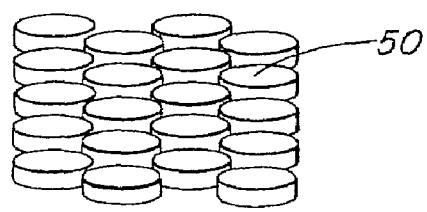
FIG. 9 illustrates the fabrication of device pills patterned through epilayers according to the concepts of the present invention.
Figure 10:
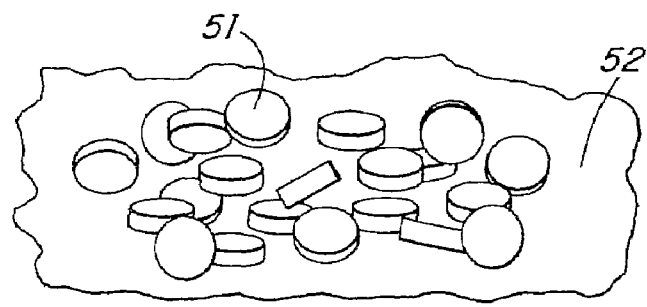
FIG. 10 illustrates device pills etched free of substrate and in a slurry according to the concepts of the present invention.
Figure 11:
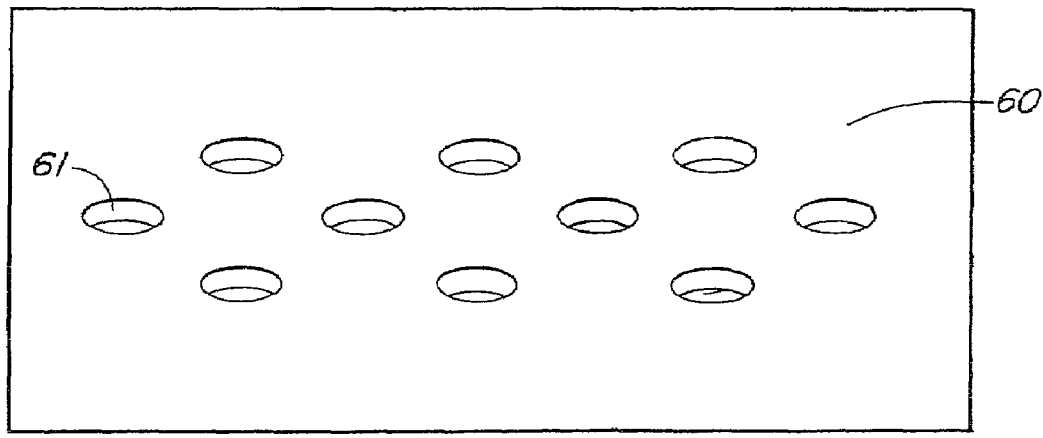
FIG. 11 illustrates dielectric device recesses etched into a CMOS wafer according to the concepts of the present invention.

As shown in FIG. 9, compound semiconductor heterostructures 50 are fabricated through epilayers. The fabricated compound semiconductor heterostructures 50 are then etched to produce free semiconductor heterostructure pills 51 which can be added to a slurry 52, as illustrated in FIG. 10. The surface of commercially-processed integrated circuit wafer 60 has formed thereon recesses 61 that can accept the semiconductor heterostructure pills 51, as illustrated in FIG. 11.

Figure 12:
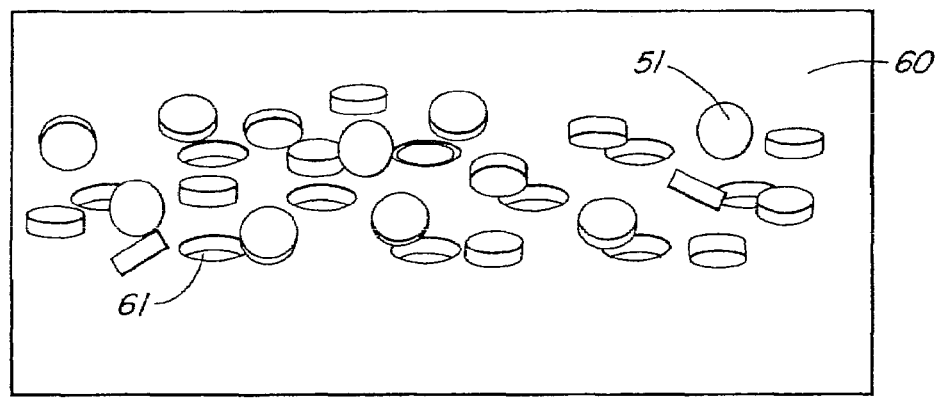
FIG. 12 illustrates device pills within a slurry tumbling over recesses on a CMOS wafer according to the concepts of the present invention.
Figure 13:
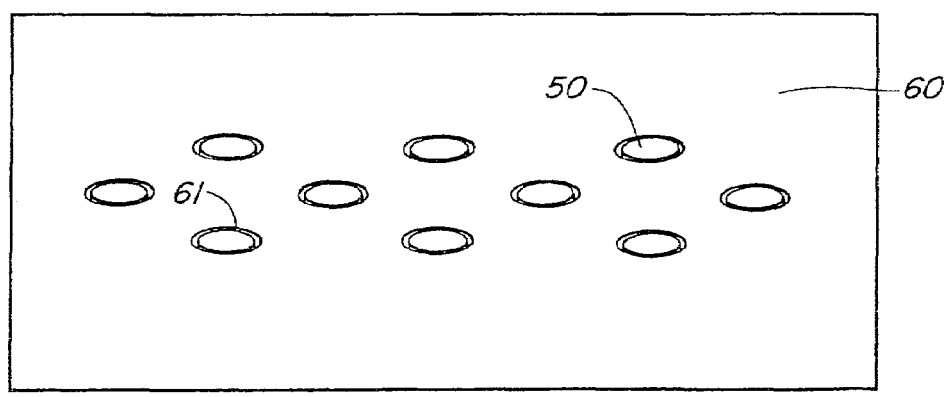
FIG. 13 illustrates device pills in place filling all recesses on a CMOS wafer according to the concepts of the present invention.

As illustrated in FIG. 12, the surface of a wafer 60 prepared with recesses 61 is flooded with semiconductor heterostructure pills 51, which are preferably in a slurry. The number of semiconductor heterostructure pills 51 in the slurry is one or two orders of magnitude many times more than are needed to fill the recesses 61. The large number of semiconductor heterostructure pills 51 means that there are many pills in the vicinity of each of the recesses 61, and the highly symmetric nature of the semiconductor heterostructure pills 51 and recesses 61 results in a high probability that a semiconductor heterostructure pill 50 in the vicinity of a recess 61 will fall into it as illustrated in FIG. 13.

To ensure that the semiconductor heterostructure pill 50 maintains its location within the recess 61, a strong short-range magnetic attractive force, in one embodiment of the present invention, comes into play when the semiconductor heterostructure pill 50 settles into the recess 61 to keep the semiconductor heterostructure pill 50 from being removed from the recess 61 by gravity or by another semiconductor heterostructure pill or by the fluid used to flood the surface with semiconductor heterostructure pills 51. In another embodiment of the present invention, the semiconductor heterostructure pill 50 maintains its location within the recess 61 due to a strong short-range attractive force resulting from an electric field.

Figure 14:
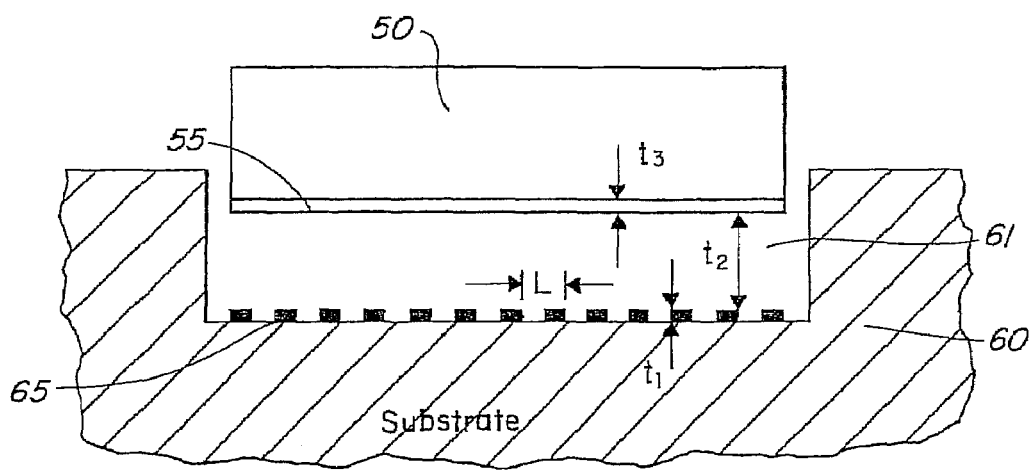
FIG. 14 illustrates a device pill and a recess according to the concepts of the present invention.

FIG. 14 illustrates a semiconductor heterostructure pill structure and a recess structure that enables the strong short-range magnetic attractive force to be realized and effective. As illustrated in FIG. 14, a semiconductor heterostructure pill 50 includes a thin permalloy layer 55 on at least one side of the semiconductor heterostructure pill 50. The permalloy layer 55 is preferably a Ni/Fe layer. Within the substrate 60, a recess 61 is formed. The recess 61 includes a plurality of magnetized stripes 65 of material. The material for the magnetized stripes 65 is preferably Co/Pt.

As noted above, magnetic attraction is used to hold the semiconductor heterostructure pill 50 in a recess 61. Thus, it is important to understand the retentive force that can be achieved by the present invention and to compare it with, for example, the force of gravity acting on a semiconductor heterostructure pill 50. It is also important to determine how quickly this force varies with separation to be certain that only semiconductor heterostructure pills 50 well positioned in a recess 61 will be held in place while those that have only partially entered will be free to be moved about and have their position adjusted and corrected.

For purposes of calculating the attractive force between a semiconductor heterostructure pill 50 and a magnetized pattern 65 at the bottom of a dielectric recess 61, the relationship illustrated in FIG. 14 will be utilized.

The relationship illustrated in FIG. 14 consists, first of a high-coercivity magnetic film of thickness $t_1$ which has a remanent magnetization $M_s$, normal to plane and which has been etched into a pattern of equal width stripes 65 and spaces with a period L (i.e. etched into stripes 65 of width L/2, each stripe 65 spaced L/2 from an adjacent stripe 65). A distance $t_2$ above this layer is a soft magnetic film 55 of thickness $t_3$ with a magnetic permeability $\mu$ In practice, the first layer 65 might be a cobalt-platinum alloy, and the second layer 55 might be permalloy or nickel.

The magnetization of the first layer 65 can be expanded in a Fourier series and written as:

$$M_x(y) = \frac{M_s}{2} + \frac{2M_s}{\pi} \sum_{n\,odd} \frac{1}{n} \sin\frac{2\pi n y}{L}$$

where the x-direction has been taken normal to the plane, the y-direction is in the plane normal to the stripes 65 and spaces, and the z-direction is parallel to the stripes 65.

The first term does not lead to any attractive force, and the sinusoidal terms act independently and their contributions sum to give an attractive force per unit area, F/A of:

$$\frac{F}{A} = \sum_{n\,odd} \frac{\mu_0 M_s^2}{n^2 \pi^2} (1 - e^{-2\pi n t_1/L})^2 e^{-4\pi n t_2/L} \frac{\sinh(2\pi n t_3/L)}{\sinh\left[2\pi n t_3/L + \ln\frac{\mu+\mu_o}{\mu-\mu_0}\right]}$$

Examining this expression, the n=1 term is the most important for two reasons. First, the contributions of the higher order terms fall off as $1/n^2$, and, second, the $t_2$ term falls off very quickly with distance above the magnetized stripes for reasonable L and all n other than n=1. The attractive force per unit area is thus approximately that due to the n=1 term:

$$\frac{F}{A} \approx \frac{\mu_0 M_s^2}{\pi^2} (1 - e^{-2\pi t_1/L})^2 e^{-4\pi t_2/L} \frac{\sinh(2\pi t_3/L)}{\sinh\left[2\pi t_3/L + \ln\frac{\mu+\mu_o}{\mu-\mu_0}\right]}$$

An instructive way to consider this result is by examining its four terms individually. The first term depends on the saturation magnetization, $M_s$, of the permanently polarized layer. One can evaluate it for representative materials to determine the maximum attractive force possible as the value of the other terms approaches one. This is done in Table 1 for nickel, cobalt, and iron.

TABLE 1

| Maximum force, $\mu_0 M_s^2/\pi^2$ | |
|---|---|
| Material | Value (nt/m²) |
| Nickel | 3.0 × 10⁴ |
| Cobalt | 2.7 × 10⁵ |
| Iron | 3.7 × 10⁵ |

Table 1—The maximum attractive force per unit area (i.e. the multiplier term) for three magnetic materials: nickel, chromium, and iron. All other terms in the force expression have values between 0 and 1 (see Tables 2, 3, and 4).

The second term represents the dependence of the force on the thickness of the magnetized layer. Table 2 tabulates this term for layer thickness, $t_1$, is one-tenth the pattern period, or greater.

TABLE 2

| Dependence on stripe height, $t_1$, and period, L | Stripe height, $t_1$ | | |
|---|---|---|---|
| Period, L | 0.2 μm | 0.5 μm | 1.0 μm |
| 2 μm | 0.22 | 0.63 | 0.92 |
| 5 μm | 0.043 | 0.22 | 0.52 |
| 10 μm | 0.014 | 0.073 | 0.22 |

Table 2—the Variation of the attractive force per unit area with the thickness of the magnetized layer 65, $t_1$, for several values of the pattern period, L.

The third term shows how the force decreases as the separation between the two magnetic layers increases. This term is tabulated in Table 3 for separations $t_2$, between 0.2 and 10.0 μm. What is striking about Table 3 is the quickness with which the force decreases with distance when the pattern period is small. For the present invention, it would be desirable to have a strong attractive force when the spacing is a micron or less, and very little when it is more than a few microns. This implies that the pattern period should be at least 5 μm. The problem with making it much larger than 5 μm, however, is that the number of stripes per recess will be small and the force, which was modeled assuming that the semiconductor heterostructure pill 50 and recess 61 were much larger than L in the y and z directions, will be less than calculated our equation. Consequently, 5 μm is a good compromise value.

TABLE 3

| Dependence on period, | Period, L | | |
|---|---|---|---|
| L, and separation, $t_2$ | 2 μm | 5 μm | 10 μm |
| 0.5 μm | 0.043 | 0.285 | 0.533 |
| 1.0 μm | 0.002 | 0.081 | 0.286 |
| 2.0 μm | 0.000 | 0.007 | 0.081 |
| 5.0 μm | 0.000 | 0.000 | 0.002 |
| 10.0 μm | 0.000 | 0.000 | 0.000 |

Table 3—the variation of the attractive force per unit area with the separation between the magnetic layer 55 and the magnetized layer 65, $t_2$, for several values of the pattern period, L.

The fourth, and final, term accounts for the parameters and characteristics of the soft magnetic layer on the semiconductor heterostructure pill 50. This term is tabulated in Table 4 for a pattern period, L, of 5 μm layer thicknesses, $t_3$, of 0.2, 0.5, and 1.0 μm, and relative layer permeabilities, $\mu\mu_0$, of 50, 100, and 200. We see that for a relative permeability of 50 or more, a film thickness of 0.2 μm is already sufficient to make this term greater than 0.75.

TABLE 4

| Dependence on layer thickness and permeability when L = 5 μm | Layer thickness, $t_3$ | | |
|---|---|---|---|
| Relative permeability $\mu'\mu_0$ | 0.2 μm | 0.5 μm | 1.0 μm |
| 2 μm | 0.76 | 0.93 | 0.95 |
| 5 μm | 0.86 | 0.98 | 0.98 |
| 10 μm | 0.93 | 0.98 | 0.99 |

Table 4—The variation of the attractive force per unit area with the thickness of the magnetic layer, $t_3$, for several values of the relative permeability, $\mu\mu_0$, when the pattern period, L, is 5 microns.

It is worth noting that in the calculations above, the magnetization of the film may saturate so the calculations may over estimate the force when $t_2$ is very small, however the calculations give a good estimate until the magnetization does saturate. As will be clear below, by that point the magnetic attractive force will already be more than sufficient to retain the semiconductor heterostructure pill 50 in the recess 61.

Figure 15:
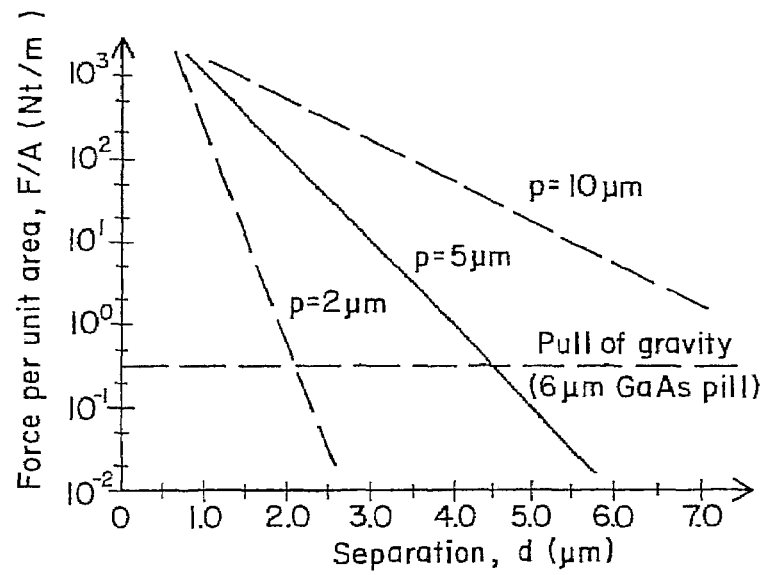
FIG. 15 illustrates the magnetic retention relationship for holding pills in recesses according to the concepts of the present invention.

In a preferred embodiment, the present invention utilizes a 0.5 μm thick cobalt-platinum alloy layer 65 ($M_S$=1.8 Telsa) in the recess 61. The 0.5 μm thick cobalt-platinum alloy layer 65 is patterned into stripes 65 with a period of 5 μm. The preferred embodiment of the present invention utilizes a 0.2 μm thick nickel layer 55 on the semiconductor heterostructure pill 50. In this combination, the force per unit area on the semiconductor heterostructure pill 50 will vary with the separation, $t_2$, as shown in FIG. 15.

For comparison, the gravitational force on a GaAs pill 6 μm thick is approximately 0.3 nt/m². This value, which one might consider being representative of the largest force that would be available to pull the pill out of the recess (if, for example the wafer is inverted) is indicated as a horizontal line in FIG. 15. It is exceeded for $t_2$<4 μm, which is a comfortable result.

The attractive force on the semiconductor heterostructure pills 50 will be negligible until the semiconductor heterostructure pill 50 settles into a recess 61, but once the semiconductor heterostructure pill 50 is in the recess 61 the semiconductor heterostructure pill 50 will be strongly held in place. The layer thicknesses of the present invention are very reasonable, and the stripes are easy to pattern, yet narrow enough that a typical recess 25 to 30 μm in diameter will contain ten or more stripes.

The stripe pattern for the magnetic layer 65 in the recesses 61 is a particularly easy one to analyze, as well as to produce, but one can easily imagine that other patterns might offer advantages in terms of the attractive force they produce and their immunity to holding poorly located semiconductor heterostructure pills 50 in a well. One can also imagine patterns that could center, and perhaps even orient angularly, the semiconductor heterostructure pills 50 within a well 61 with a high level of precision.

The present invention will be further explained in connection with FIGS. 16-19. The present invention, as noted above, is an assembly process, that begins with the preparation of the substrate 60 and of the semiconductor heterostructure pills 50.

Figure 16:
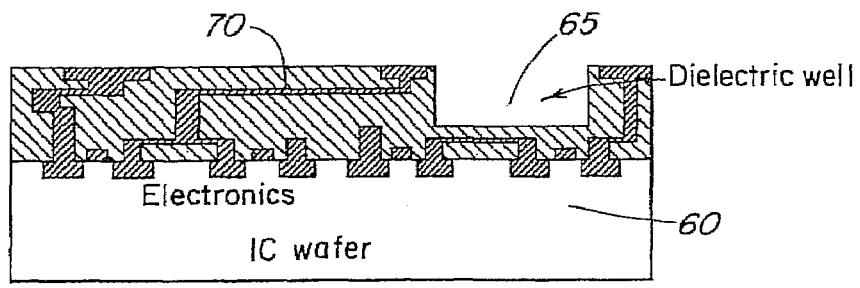
FIG. 16 illustrates an IC wafer with a dielectric well according to the concepts of the present invention.

As illustrated in FIG. 16, the substrate 60 can be either the final integrated circuit wafer or an intermediate handle wafer. In either case, shallow recesses 67 are patterned into the thick dielectric layers 70 covering the wafer surface, as shown in FIG. 16. The depth of the recesses matches the thickness of the semiconductor heterostructure pills. In a preferred embodiment of the present invention, the depth of the recess 67 is about 4 microns and the width or diameter of the recess 67 is 30 microns.

As noted above, a high coercivity magnetic layer, such as a cobalt-platinum alloy, is then deposited on the wafer 60 and patterned in the bottom of the recesses 67. The pattern can be a simple array of stripes, a pattern of squares or rectangles, or it can be more complex. After the film is patterned, it is magnetized normal to the wafer surface, and the wafer is ready for the assembly step. It is noted that the film may also be magnetized in the plane of the substrate or wafer. In other words, the magnetization is parallel to a surface of the substrate.

It is also noted that the film may be magnetized such that the magnetic field is at an oblique angle to the surface of the substrate or wafer. An oblique magnetic field is where the magnetization has both magnetization components perpendicular (normal) to the surface and magnetization components in plane of the substrate. By utilizing an oblique magnetic field, the oblique magnetic field can be used to properly orientate the heterostructure pill within the recess.

Furthermore, the film may already be magnetized prior to depositing or patterning.

In an alternative, the film may be a magnetically patternable continuous film deposited on the wafer. This continuous film would not be physically patterned as noted above, but the continuous film would be magnetized with a patterned magnetization. In other words the film is not patterned, but rather the magnetization is patterned on the film.

In a further alternative to the high coercivity magnetic layer, micro-electromagnets can be deposited in the bottom of the recesses 67 on the wafer 60. In this embodiment, the micro-electromagnets can be turned on and off to control the positioning of the heterostructure 50 within the recess 67.

In a still further alternative, the high coercivity magnetic layer may be magnetized prior to or while being deposited into the recesses, and thus, the layer need not be magnetized while in the recess. The high coercivity magnetic layer may also be pre-patterned prior to depositing, and thus, the patterning etching is not required.

Figure 17:
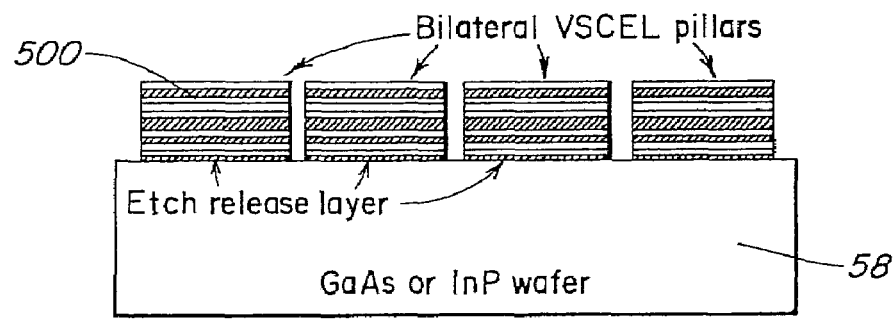
FIG. 17 illustrates grown bilateral pillars or heterostructures according to the concepts of the present invention.

As illustrated in FIG. 17, the formation of the semiconductor heterostructure pills 50 begins with an epitaxial wafer 58. The heterostructure 50, from which the devices being integrated are to be fabricated, is grown under optimal conditions on the optimum substrate. The heterostructure 50 contains an etch-free layer that can be selectively etched away to free the device heterostructure 50 from the substrate.

In a preferred embodiment, the epitaxial wafer 58 is next patterned into a close-packed array of cylindrical mesas 500, as shown in FIG. 17. At some point in this processing, a thin layer of nickel is also deposited on at least one side of the semiconductor heterostructure pills 50.

Figure 18:
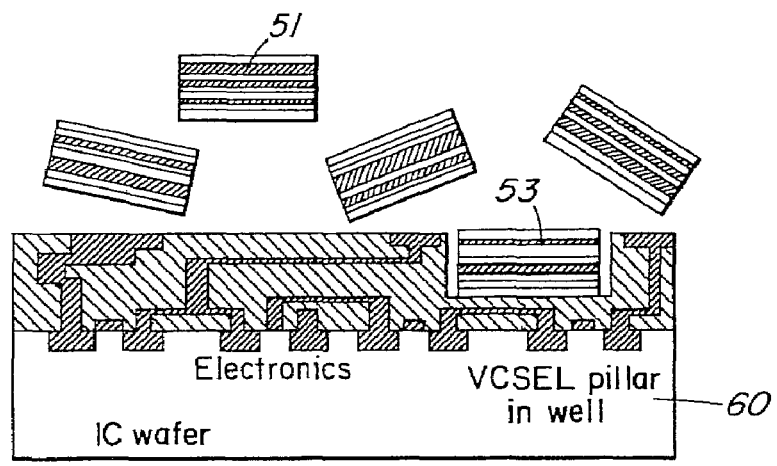
FIG. 18 illustrates a pill captured and magnetically retained within a well according to the concepts of the present invention.
Figure 19:
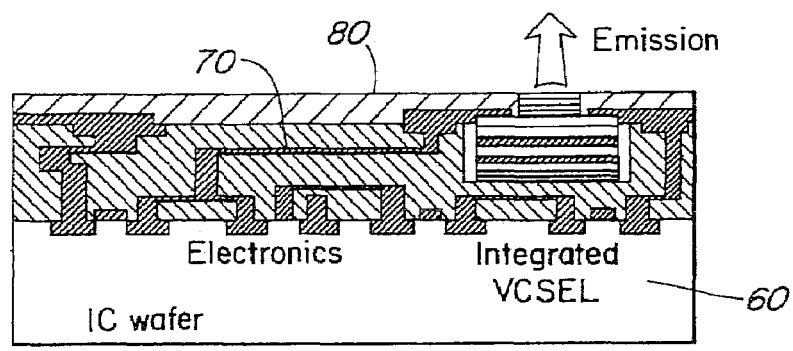
FIG. 19 illustrates a pill processed into a finished device and interconnected with electronics to complete an optoelectronic integrated circuit according to the concepts of the present invention.

During assembly, the surface of a wafer prepared, as described above, will be flooded with several orders of magnitude more semiconductor heterostructure pills 51 than are needed to fill its recesses 67, as shown in FIG. 18. The large number of semiconductor heterostructure pills 51 will mean that there are many pills in the vicinity of each of the recesses 67, and the symmetric nature of the semiconductor heterostructure pills 51 will result in a high probability that a semiconductor heterostructure pill 51 in the vicinity of a recess 67 will fall into it. The result will be that the probability that a given recess is filled will be very nearly one, as illustrated in FIG. 19.

The strong short-range magnetic attractive force comes into play when a semiconductor heterostructure pill 53 settles into a recess 67. The strong short-range magnetic attractive force will keep semiconductor heterostructure pill 53 from being removed from the recess 67 by gravity or by another semiconductor heterostructure pill or by the fluid used to flood the surface with semiconductor heterostructure pills.

It is noted that the hard and soft magnetic layers can be engineered so that only those semiconductor heterostructure pills that go into a recess with the right side up (i.e., soft magnetic film side down) will stay there.

If the semiconductor heterostructure pills are assembled on a carrier wafer, the semiconductor heterostructure pills can be transferred to the recesses on the circuit wafer by aligned pillar bonding.

Once the semiconductor heterostructure pills are on the circuit wafer, the semiconductor heterostructure pills can be fixed in position using a polymer 80, as illustrated in FIG. 19, which will also fill in any voids on the surface surrounding the semiconductor heterostructure pills and planarize the surface.

Figure 20:
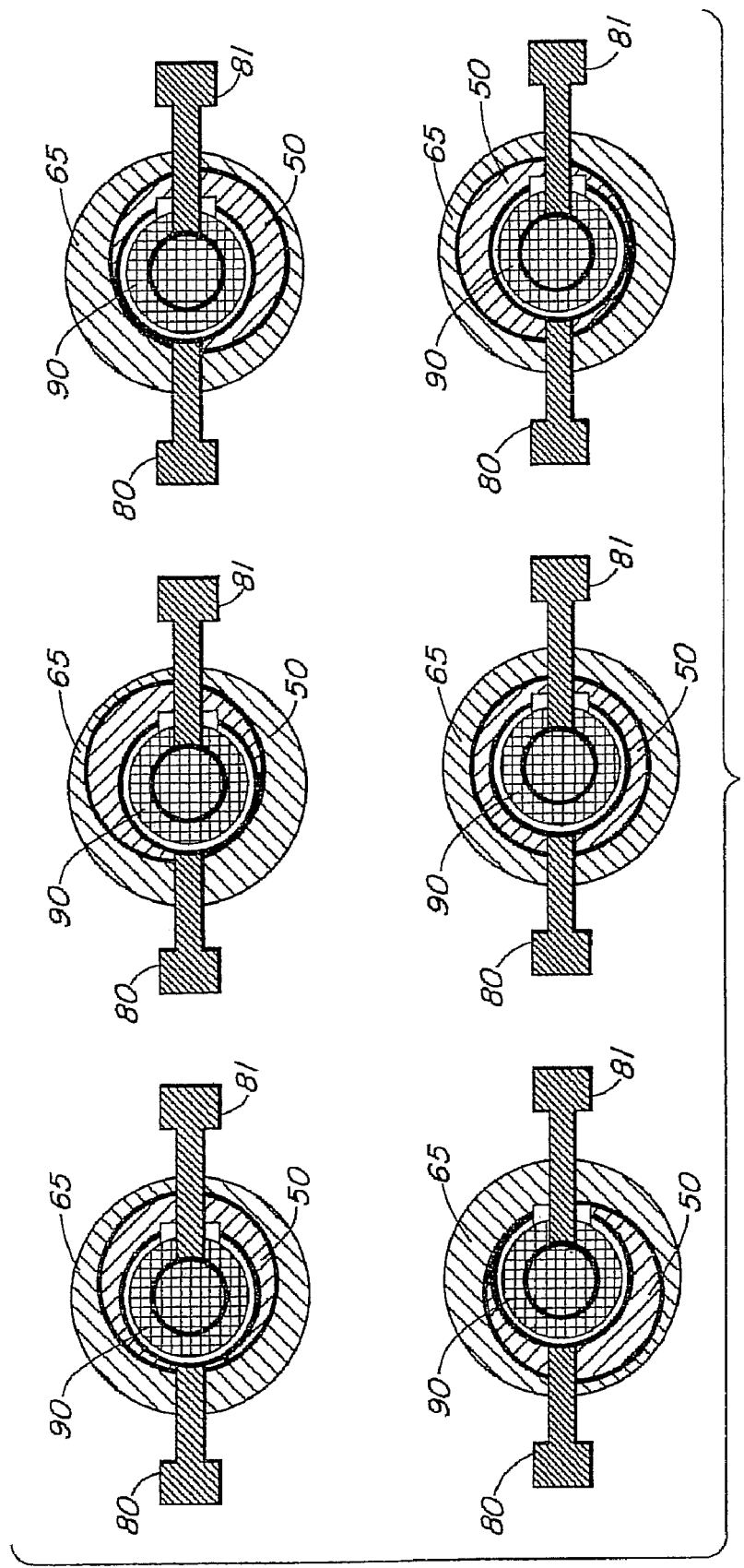
FIG. 20 illustrates the insensitivity of the pill assembly to pill misalignment according to the concepts of the present invention.

Processing of the heterostructures to convert them into devices and integrate them with the underlying electronics, as illustrated in FIG. 20, then proceeds using standard monolithic photolithographic processes. An important consequence of completing the processing only after the semiconductor heterostructure pills are in their final location, as illustrated in FIG. 20, is that the final alignment of the devices will be determined photolithographically and is independent of how precisely the semiconductor heterostructure pills are located in their respective recesses.

In other words, by doing the device processing after attaching the heterostructures to the wafer, the device-to-device and device-to-circuit alignment is determined lithographically. Moreover, since the present invention provides near-planar surface topology and wafer-level processing, the patterning and alignment of the heterostructures can be very precise.

More specifically, as illustrated in FIG. 20, assembling of the semiconductor heterostructure pills is insensitive to semiconductor heterostructure pill misalignment. As seen from the various examples, the semiconductor heterostructure pill 50 is not always perfectly aligned in the recess 67. Since the entire surface of the semiconductor heterostructure pill 50 is not needed for the device to operate properly, a misaligned semiconductor heterostructure pill 50 still provides an ample mesa 90 from which to fabricate a properly functioning device.

The misaligned semiconductor heterostructure pill 50 is processed such that electrodes 80 and 81 are formed to communicate electrically with an active portion mesa 90. Therefore, the semiconductor heterostructure pills 50 can be misaligned in their recesses 67, yet the devices will all be well aligned. It is noted that FIG. 20 is not to scale, as the actual semiconductor heterostructure pills are a tighter fit to the recesses.

Figure 21:
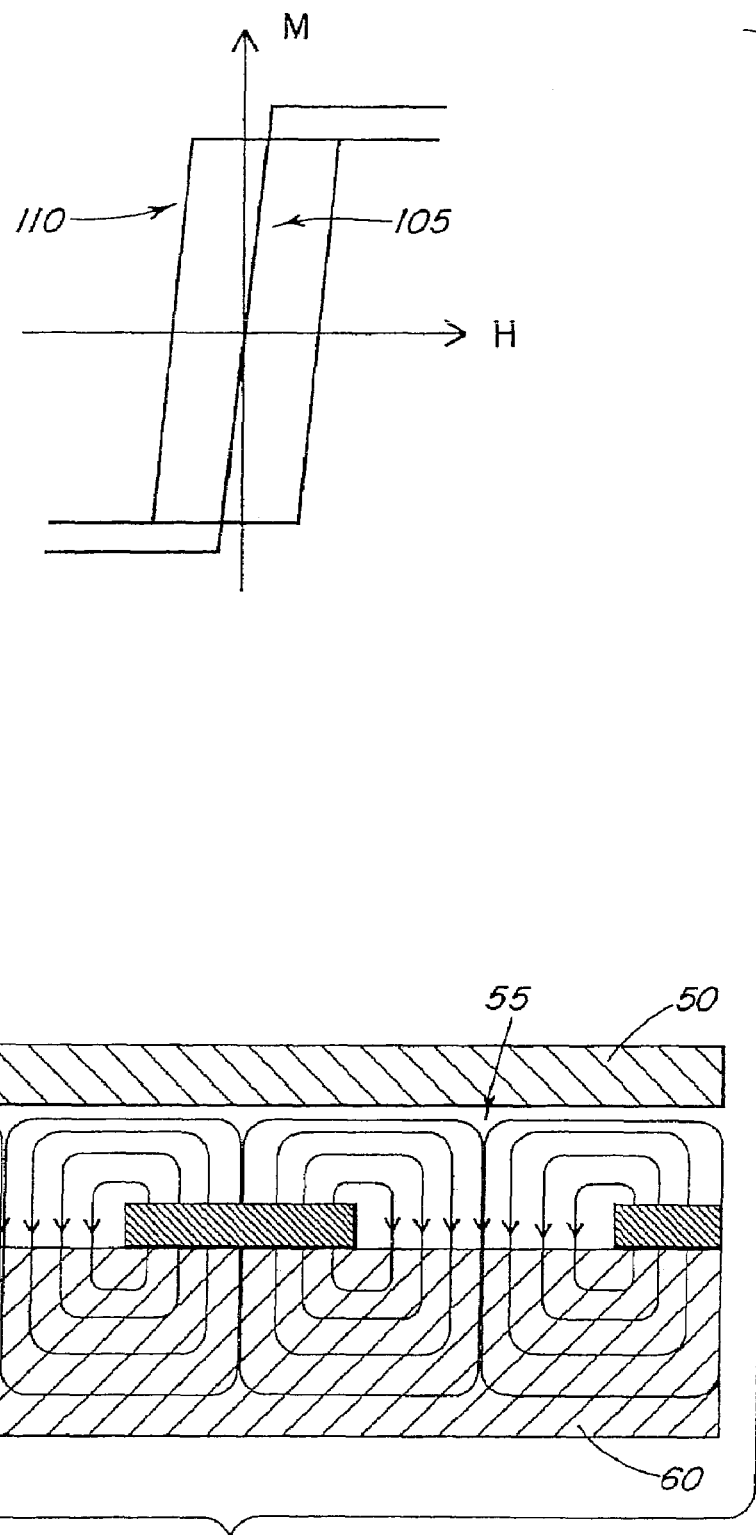
FIG. 21 illustrates the magnetization curves and magnetic field lines of the magnetized film of the well and the soft magnetic film of the pill according to the concepts of the present invention.

FIG. 21 illustrates the magnetic relationship between the thin permalloy layer 55 on at least one side of the semiconductor heterostructure pill 50 and the plurality of magnetized stripes 65 in the recess. More specifically, FIG. 21 shows the magnetic field lines 100 that provide the strong short-range magnetic attractive force, which keeps semiconductor heterostructure pill from being removed from the recess. Furthermore, FIG. 21 shows the magnetization curve 105 for the thin permalloy layer and the magnetization curve 110 for the magnetized stripes in the recess.

The present invention also contemplates the use of bilateral device heterostructures. An example of the application of this technique is in optoelectronic integration, for example the integration of vertical-cavity surface-emitting lasers (VCSELs) with silicon CMOS electronic circuitry.

Taking optoelectronic integration as the application for purposes of discussion, the objective of heterogeneous integration is typically to combine III-V semiconductor devices and silicon devices on a common substrate (the former being necessary for laser diodes, for example, and the latter being preferred for microprocessors, memory, and many other integrated electronic circuits). These materials in general have significantly different lattice constants and thermal expansion coefficients, making wafer-scale integration very difficult.

The problem is further complicated by the unavailability of III-V wafers as large in diameter as available silicon wafers; 8" is the standard Si wafer diameter with 12" being available, whereas the largest III-V substrates are 6" GaAs.

The bilateral heterostructure solder bump integration technique of the present invention uses the same principles discussed above in that the III-V heterostructures are located in dielectric windows, or recesses, etched into the dielectric layer overcoating a processed IC wafer.

In this application of the present invention, the III-V heterostructures are located in dielectric windows (recesses) on an IC wafer as individual heterostructure pills. These heterostructure pills can be thought of as the pillars in aligned pillar bonding etched free of the substrate before being bonded into their wells except the heterostructure pills have some very important differences. First, the heterostructure pills can be patterned and etched in a dense, close-packed array, rather than having to be etched in the generally sparse pattern matching the growth window pattern.

The heterostructure pills' preferred shape is cylindrical, but the heterostructure pills can be any shape. Second, the heterostructures are designed so that when the heterostructure pills are etched free, either side of the pill can be up. This bilateral nature is a key part of this embodiment of the present invention.

Being bilateral, the heterostructure pills can never rest in the recess (window) upside down; either way is "right side up". And since the final device patterning and processing is done after the heterostructures are in position in the windows, there is no preferred orientation of the heterostructure pill in the recess; the heterostructure pills have a high degree of rotational symmetry in the plane and can be turned in any direction.

Third, the IC wafer can be any material, e.g., it can be silicon; and, as importantly, the IC wafer can be any size, e.g. it can be as large as 12". Although the examples given above, discuss the substrate as being an IC wafer, the substrate may or may not be an IC wafer or may be any type of semiconductor wafer. Moreover, the substrate may be of any material, such as but not limited to, silicon, ceramics, glass, plastic, or polymers.

At the same time, the heterostructure pillars can be grown on any diameter wafer, and can even come from different wafers, so the unavailability of large diameter III-V wafers is not a limitation.

The filling of the recesses in an IC wafer with bilateral pills is done in the same manner as discussed above, by covering the wafer surface with heterostructure pills, having the heterostructure pills fill all the recesses, and then removing the excess heterostructure pills for use on subsequent wafers. The heterostructure pills are then fixed in position in their recesses and the processing proceeds.

Moreover, the concepts of the present invention also contemplate utilizing electrical forces to maintain the semiconductor heterostructure pill 50 within the well. More specifically, the direct electric duality to the magnetically assisted process described above, with respect to FIGS. 14 and 16-19, can assist in the assembly of integrated circuit wafers.

In this alternative embodiment, rather than using magnetic materials in the wells or recesses, electret materials such as Teflon™, polyvinylidene fluoride (PVDF or Kynar), or wax is deposited in the wells or recesses and are polarized to create an electric field in the same manner as described above with respect to creating the magnetic attraction. It is noted that the electret material may be polarized before depositing in the well.

Also, the electret material may be patterned in a similar fashion, as discussed above, with respect to the magnetic layer embodiment. Furthermore, the electret material may be a continuous film or layer wherein the film is polarized in a predetermined pattern. The actual thickness of the electret material is on the same order of magnitude as the magnetic material formed in the recesses.

As with the magnetically assisted embodiment, the electret material may be polarized to produce an electric field that is normal to the surface of the wafer, in the plane of the surface of the wafer, or at an oblique angle to the surface of the wafer.

Lastly, as an alternative to the electret material, the wells or recesses may include microelectrodes that can be used to create an electric field to attract the semiconductor heterostructure pills 50.

In this embodiment, the semiconductor heterostructure pills 50 include at least one dielectric layer that is attracted to the electrets. The actual thickness of the dielectric layer is on the same order of magnitude as the magnetic material formed on the semiconductor heterostructure pills.

With respect to the various embodiments of the present invention described above, the present invention provides various features and advantages.

For example, the heterostructure pills and the recesses the heterostructure pills will occupy are highly symmetrical making it easy for a heterostructure pill to settle into a recess.

Moreover, short-range magnetic attraction or short-range electrical attraction is used to hold the heterostructure pills in their recesses once the heterostructure pills have settled into place right side up, thereby insuring that all the recesses will stay properly filled even as the excess heterostructure pills are removed. The magnetic or electrical attraction used to hold the heterostructure pills in their recesses is a very short range force so it will hold a heterostructure pill in a recess only after it is well positioned within the well. In one embodiment, since the heterostructure pills themselves are not permanently magnetized, the heterostructure pills will not stick together magnetically, nor will multiple heterostructure pills stack up in a recess.

The heterostructure pills are located in recesses that properly position the heterostructure pills spatially and keep the wafer surface planar for subsequent high resolution photolithographic processing. Furthermore, the device patterning and processing is done after the heterostructure pills are in position in the recesses, making the process pseudo-monolithic, meaning that all of the devices will be in accurate alignment one with another and to the underlying circuitry, independent of how well the heterostructure pills are centered. It is noted that the present invention also contemplates that the heterostructure pills may be partially processed or fully processed prior to being placed in position in the recesses of the wafer.

Another advantage of the present invention is that the heterostructure pills are sized to fit in the recesses so that their top surfaces are substantially co-planar with the upper surface of the wafer, which facilitates fine line lithography of device patterns. Also, the present invention is compatible with locating the heterostructure pills over devices in the integrated circuit, meaning that it is possible to do three-dimensional integration and thereby achieve higher device densities. The heterostructure pill attachment process can be repeated to integrate several different devices on the same wafer, which increases the flexibility of the technique, and the electronics, the heterostructure material, and the heterostructure pills can all be tested and/or sorted before integration.

The present invention, being pseudo-monolithic, is compatible with wafer-scale, multi-wafer processing, so that it achieves the economies of scale common to monolithic integration. Similarity, it achieves the advantages of reduced parasitics and increased packing density, ruggedness, and reliability shared by all monolithic integration techniques. The present invention also can be done on silicon wafers of any diameter, and is not limited by the lack of similarly large diameter III-V wafers. It is, in fact, not limited to integration on silicon wafers, but that is its primary application.

The heterostructure pills of the present invention are patterned in a close-packed array making efficient use of the heterostructure material, and once the heterostructure pills are etched free, the substrate can be reused. The heterostructures can be grown using the optimum technology under optimal conditions and can be obtained from the most desirable source; similarly the electronic wafers can be obtained from any appropriate source, particularly wafer foundries. It is noted that the heterostructure pills of the present invention may be partially or fully processed devices, as well as raw heterostructure structures. Moreover, it is noted that the heterostructure pills of the present invention may contain several devices, or the heterostructure pills of the present invention may contain small or medium scale integrated circuits.

The present invention can be conducted on commercially processed silicon integrated circuit wafers, taking full advantage of existing industrial processes and state of the art technology and taking full advantage of wafer level, batch processing to minimize cost, and to maximize performance, density, complexity, and reliability. The present invention can also be performed on a variety of other electronic substrates, including GaAs and InP IC wafers.

When utilizing the concepts and processes of the present invention, the IC wafer can be tested prior to assembly, and the device material can also be characterized before etching the heterostructure pills free so that any defective regions on the epitaxial wafer can be avoided and those heterostructure pills not used. Lastly, the heterostructure pills can be bilateral, meaning that either side can be up.

In summary, the present invention overcomes the problems of lattice constant and thermal expansion coefficient mismatch between SI and the III-V's, and can be used to produce monolithic optoelectronic integrated circuits of unprecedented complexity. The present invention also overcomes the inefficient use of epitaxial material, restrictions on the IC substrate, and the lack of 8" and 12" III-V wafers. The present invention provides a modular solution to the general problem of heterogeneous integration which retains and exploits all of the advantages of monolithic, batch processing and fine-line lithography that have driven the Moore's Law growth of the integrated circuit industry for the past 40 years. The present invention also builds directly on existing commercial integrated circuit processes in a modular fashion. That is, the present invention is done after conventional back end processing (BEP) is completed. Forming the optical solder bumps does not require that new steps be integrated within an established process, but is done by adding "final" steps.

While various examples and embodiments of the present invention have been shown and described, it will be appreciated by those skilled in the art that the spirit and scope of the present invention are not limited to the specific descrip-

What is claimed is:

1. A wafer, comprising:
   a substrate;
   a dielectric layer formed on said substrate;
   at least one recess formed within said dielectric layer during fabrication;
   a micro-electromagnet formed in at least one recess; and
   a heterostructure pill, having formed thereon a magnetic layer, located in a recess formed within said dielectric layer, said micro-electromagnet and the magnetic layer being adjacently located.

2. The wafer as claimed in claim 1, further comprising:
   a polymer formed over said dielectric layer, said recess, and said heterostructure pill.

3. The wafer as claimed in claim 1, wherein said magnetic layer comprises permalloy.

4. The wafer as claimed in claim 1, wherein said magnetic layer comprises an alloy of nickel and iron.

5. The wafer as claimed in claim 1, wherein said magnetic layer comprises an alloy of nickel.

6. The wafer as claimed in claim 1, wherein said micro-electromagnet produces a magnetic field in a direction substantially normal to the wafer surface.

7. The wafer as claimed in claim 1, wherein said micro-electromagnet produces a magnetic field in a direction substantially in plane with the wafer surface.

8. The wafer as claimed in claim 1, wherein said magnetic layer comprises an alloy of iron.

9. The wafer as claimed in claim 1, wherein said micro-electromagnet produces an oblique magnetic field with respect to the wafer surface.

10. A wafer, comprising:
    a substrate;
    a dielectric layer formed on said substrate;
    a recess formed within said dielectric layer during fabrication; and
    a micro-electromagnet formed within said recess such that a first side of said micro-electromagnet is formed directly upon a bottom of said recess;
    said recess having a first height;
    said micro-electromagnet having a second height;
    said second height being less than a difference between said first height and said second height.

11. The wafer as claimed in claim 10, wherein said micro-electromagnet produces a magnetic field in a direction substantially normal to the wafer surface.

12. The wafer as claimed in claim 10, wherein said micro-electromagnet produces a magnetic field in a direction substantially in plane with the wafer surface.

13. The wafer as claimed in claim 10, wherein said micro-electromagnet produces an oblique magnetic field with respect to the wafer surface.

* * * * *

UNITED STATES PATENT AND TRADEMARK OFFICE
CERTIFICATE OF CORRECTION

| | | |
|---|---|---|
| PATENT NO. | : 7,323,757 B2 | Page 1 of 1 |
| APPLICATION NO. | : 10/350778 | |
| DATED | : January 29, 2008 | |
| INVENTOR(S) | : Fonstad, Jr. et al. | |

It is certified that error appears in the above-identified patent and that said Letters Patent is hereby corrected as shown below:

Please add the following to the specification of U.S. Patent No. 7,323,757 on Page 1, column 1, line 31:

-- SPONSORSHIP INFORMATION
This invention was made with government support by the Army Research Office (ARO) under Grant Number DAAG55-98-1-0320. The government has certain rights in the invention. --

Signed and Sealed this

Nineteenth Day of May, 2009

JOHN DOLL
*Acting Director of the United States Patent and Trademark Office*